United States Patent
Kishi et al.

(10) Patent No.: US 8,196,430 B2
(45) Date of Patent: Jun. 12, 2012

(54) METHOD AND APPARATUS FOR MANUFACTURING VITREOUS SILICA CRUCIBLE

(75) Inventors: Hiroshi Kishi, Akita (JP); Minoru Kanda, Akita (JP); Masaki Morikawa, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 338 days.

(21) Appl. No.: 12/303,994

(22) PCT Filed: Nov. 28, 2008

(86) PCT No.: PCT/JP2008/071704
§ 371 (c)(1),
(2), (4) Date: Sep. 1, 2009

(87) PCT Pub. No.: WO2009/069773
PCT Pub. Date: Jun. 4, 2009

(65) Prior Publication Data
US 2010/0244311 A1    Sep. 30, 2010

(30) Foreign Application Priority Data
Nov. 30, 2007 (JP) ................... P2007-310193

(51) Int. Cl.
C03B 19/01 (2006.01)
C03B 19/09 (2006.01)
C03B 19/06 (2006.01)

(52) U.S. Cl. .......................... 65/17.3; 65/17.4
(58) Field of Classification Search ............ 65/17.3, 65/17.4
See application file for complete search history.

(56) References Cited

U.S. PATENT DOCUMENTS

| | | | |
|---|---|---|---|
| 4,416,680 A | 11/1983 | Bruning et al. | |
| 4,759,787 A | 7/1988 | Winterburn | |
| 4,874,417 A | 10/1989 | Winterburn | |
| 4,935,046 A | 6/1990 | Uchikawa et al. | |
| 4,956,208 A | 9/1990 | Uchikawa et al. | |
| 6,548,131 B1 | 4/2003 | Englisch et al. | |
| 7,350,378 B2 | 4/2008 | Leist et al. | |
| 2002/0170316 A1* | 11/2002 | Leist et al. | 65/17.3 |
| 2009/0145351 A1* | 6/2009 | Kishi et al. | 117/208 |
| 2010/0071417 A1* | 3/2010 | Kishi et al. | 65/66 |

(Continued)

FOREIGN PATENT DOCUMENTS

DE    10033632    1/2002

(Continued)

OTHER PUBLICATIONS

E.P.O. Office action, mail date is Mar. 21, 2011.

(Continued)

Primary Examiner — Matthew Daniels
Assistant Examiner — Russell Kemmerle, III
(74) Attorney, Agent, or Firm — Greenblum & Bernstein, P.L.C.

(57) ABSTRACT

A method of manufacturing a vitreous silica crucible by a rotary mold method, which includes performing arc melting in a state in which electrodes are provided so as to be shifted from a mold central line, wherein, by this eccentric arc, the glass temperature difference during melting of a straight body portion, a curved portion and a bottom of the crucible is controlled to 300° C. or below and the thickness of a transparent layer of the straight body portion and the bottom is controlled to 70 to 120% of the thickness of a transparent layer of the curved portion.

3 Claims, 8 Drawing Sheets

U.S. PATENT DOCUMENTS

| | | | |
|---|---|---|---|
| 2010/0071613 A1* | 3/2010 | Kishi et al. | 117/208 |
| 2010/0170298 A1* | 7/2010 | Fukui et al. | 65/144 |
| 2011/0197631 A1* | 8/2011 | Sudo et al. | 65/17.4 |

FOREIGN PATENT DOCUMENTS

| | | |
|---|---|---|
| JP | 59-34659 B2 | 8/1984 |
| JP | 62-501067 A | 4/1987 |
| JP | 1-148718 A | 6/1989 |
| JP | 2000-264776 A | 9/2000 |
| JP | 2004-502630 A | 1/2004 |
| WO | 02/04368 A1 | 1/2002 |

OTHER PUBLICATIONS

English language Abstract and translation of JP 2000-264776 A Sep. 26, 2000.

English language Abstract of JP 1-148718 A Jun. 12, 1989.

\* cited by examiner

# METHOD AND APPARATUS FOR MANUFACTURING VITREOUS SILICA CRUCIBLE

BACKGROUND OF THE INVENTION

1. Field of the Invention

The present invention relates to a method of manufacturing a vitreous silica crucible using a rotary mold method, which is capable of uniformly heating an inner surface of the crucible, and more particularly, a method of manufacturing a vitreous silica crucible, which is capable of uniformly forming the thickness of a transparent layer of a curved portion and a bottom from a straight body portion of the crucible by uniformly heating an inner surface of the crucible.

Priority is claimed on Japanese Patent Application No. 2007-310193, filed Nov. 30, 2007, the content of which is incorporated herein by reference.

2. Description of the Related Art

As a method of manufacturing a vitreous silica crucible used in pulling of single-crystal silicon, a rotary mold method is known. This method is a method of depositing silica powder on an inner surface of a rotating hollow mold to a predetermined layer thickness, melting the silica powder by arc discharge of electrodes provided above the mold, sucking and decompressing (evacuating) the inside of the deposition layer of the silica powder during arc melting, vitrifying the silica powder while de-airing the air therein, and forming the inner surface of the mold into a form of a crucible (Japanese Patent No. 1257513 (JP-B No. 59-34659)).

As shown in FIG. 8, in the conventional manufacturing method, a plurality of electrodes 12 is symmetrically (point-symmetrically or linear-symmetrically) provided with respect to a central axis line of the rotary mold, and the silica powder 11 at the position corresponding to the inner surface of the crucible is melted by center arc generated in the vicinity of the central axis line L of the mold. In the arrangement of the electrode shown in FIG. 8, high-temperature gas generated at the front end of the electrodes 12 symmetrically flows with respect to the central axis line L as shown in the right and left sides of FIG. 8, a portion thereof becomes outer circulating flow Gout flowing out along the inner surface of the mold and the residual high-temperature gas becomes inner circulating flow Gin which circulates in the inner space of the mold at the both sides of the electrodes.

The inner circulating flow generated in the center arc shown in FIG. 8 is reheated when the high-temperature gas flows along the electrodes, heat efficiency is excellent, but a temperature difference between the inner circulating flow and the outer circulating flow in the inner space of the mold occurs, and thus a portion which is excessively heated by the inner circulating flow is collapsed by a viscosity drop.

The present invention provides a method of manufacturing a vitreous silica crucible, which is capable of uniformly heating an inner surface of the crucible, and uniformly forming the thickness of a transparent Layer of a curved portion and a bottom from a straight body portion of the crucible, in order to solve excessive heating due to inner circulating flow in the conventional center arc.

SUMMARY OF THE INVENTION

The present invention relates to a method of manufacturing a vitreous silica crucible, which solves the above-described problems by the following configuration.

[1] A method of manufacturing a vitreous silica crucible by arc melting silica powder deposited on an inner surface of a rotary mold, wherein arc melting is performed in a state in which an arc flame blowoff direction that generated a plurality of electrodes provided so as to be displaced from a mold rotating central line.

[2] The method according to [1], wherein, as the method of performing the arc melting in a state in which the electrodes are provided so as to be displaced from the mold central line, the arc melting is performed in a state in which the electrodes are provided at one side of the mold central line, in a state in which the number of electrodes conducted during arc melting is changed, or in a state in which the arrangement of the electrodes during arc melting is changed.

[3] The method according to [1], wherein the glass temperature difference during melting of a straight body portion, a curved portion and a bottom of the vitreous silica crucible is controlled to 300° C. or less by performing the arc melting in a state in which the electrodes are provided so as to be displaced from the mold central line.

[4] The method according to [1], wherein the thickness of a transparent layer of a straight body portion and a bottom of the vitreous silica crucible is controlled to 70 to 120% of the thickness of a transparent layer of a curved portion by performing the arc melting in a state in which the electrodes are provided so as to be displaced from the mold central line.

[5] An apparatus of manufacturing a vitreous silica crucible by arc melting silica powder deposited on an inner surface of a rotating mold using the method according to any one of [1] to [4], the apparatus comprising a rotating mold which filled silica powder, a plurality of electrodes that generate arc flame, an arc direction displaced device which enable to displace relatively the mold rotating central line which is the rotation axis of the rotary mold and the belched direction of arc flame which is the direction of generated arc flame.

[6] The apparatus according to [5], wherein the arc direction displaced device is provided an electrode position setting unit which enable to set the electrode position or/and a mold position setting unit which enable to displace the rotating mold central line.

[7] A method of manufacturing a vitreous silica crucible by arc melting silica powder deposited on an inner surface of a rotary mold, wherein arc melting is performed in a state in which electrodes are provided so as to be shifted from a mold central line.

[8] The method according to [7], wherein, as the method of performing the arc melting in a state in which the electrodes are provided so as to be shifted from the mold central line, the arc melting is performed in a state in which the electrodes are provided at one side of the mold central line, in a state in which the number of electrodes conducted during arc melting is changed, or in a state in which the arrangement of the electrodes during arc melting is changed.

[9C] The method according to [7], wherein the glass temperature difference during melting of a straight body portion, a curved portion and a bottom of the vitreous silica crucible is controlled to 300° C. or less by performing the arc melting in a state in which the electrodes are provided so as to be shifted from the mold central line.

[10] The method according to [7], wherein the thickness of a transparent layer of a straight body portion and a bottom of the vitreous silica crucible is controlled to 70 to 120% of the thickness of a transparent layer of a curved portion by performing the arc melting in a state in which the electrodes are provided so as to be shifted from the mold central line.

In a method of manufacturing a vitreous silica crucible by arc melting quartz powder deposited on an inner surface of a rotary mold, arc melting is performed in a state in which electrodes are provided so as to be shifted from a mold central line. Accordingly, a space in which the electrodes are separated from the inner surface of the mold becomes wide and high-temperature gas tends to flow out via this space. Accordingly, the inner circulating flow of the high-temperature gas is significantly reduced and thus excessive heating due to the inner circulating flow hardly occurs.

If the arc melting is performed in a state in which the electrodes are provided so as to be shifted from a mold central line, since the mold rotates, the inner surface of the crucible periodically approaches the electrodes and thus the entire crucible is uniformly heated.

In the present invention, performing the arc melting in a state in which the electrodes are provided so as to be displaced (shifted) from the mold central line indicates that the position state of the mold and the electrodes is feasible the state that outer circulating flow is more significant than inner circulating flow, in particular, the arc blowoff direction and the mold rotating axis line become parallel, and the position thereof is provided so as to be shifted, relatively angled or contortive, etc.

As the method of performing the arc melting in a state in which the electrodes are provided so as to be displaced (shifted) from the mold central line, the method of performing the arc melting in a state in which the electrodes are provided at one side of the mold central line, in a state in which the number of electrodes conducted during arc melting is changed, or in a state in which the arrangement of the electrodes during arc melting is changed may be used. By these methods, it is possible to reduce the inner circulating flow of the high-temperature gas.

According to the manufacturing method of the present invention, since local excessive overheating due to the inner circulating flow is suppressed, the entire crucible is uniformly heated and thus the glass temperature difference during melting of a straight body portion, a curved portion and a bottom of the vitreous silica crucible can be controlled to 300° C. or less.

According to the manufacturing method of the present invention, since local excessive overheating due to the inner circulating flow is suppressed, the thickness of the transparent layer of the entire crucible becomes uniform and thus, for example, the thickness of the transparent layer of the straight body portion and the bottom of the vitreous silica crucible can be controlled to 70 to 120% of the thickness of the transparent layer of the curved portion.

According to the apparatus for manufacturing a vitreous silica crucible of the present invention, above arc blowoff direction which generated by electrodes is displaced with respect to the mold rotating axis line, and thus the position relation of the electrodes and the rotating mold may be controlled that the state that outer circulating flow is more significant than inner circulating flow is a feasible state.

DETAILED DESCRIPTION OF THE INVENTION

Hereinafter, the embodiment of the present invention will be described in detail.

The present invention relates to a method of manufacturing a vitreous silica crucible by arc melting quartz powder deposited on an inner surface of a rotary mold, wherein arc melting is performed in a state in which electrodes are provided so as to be shifted from a mold central line such that local excessive overheating due to inner circulating flow is suppressed.

Hereinafter, a method of changing the arrangement of electrodes during arc melting will be described in detail with reference to the accompanying drawings.

Figure 1:
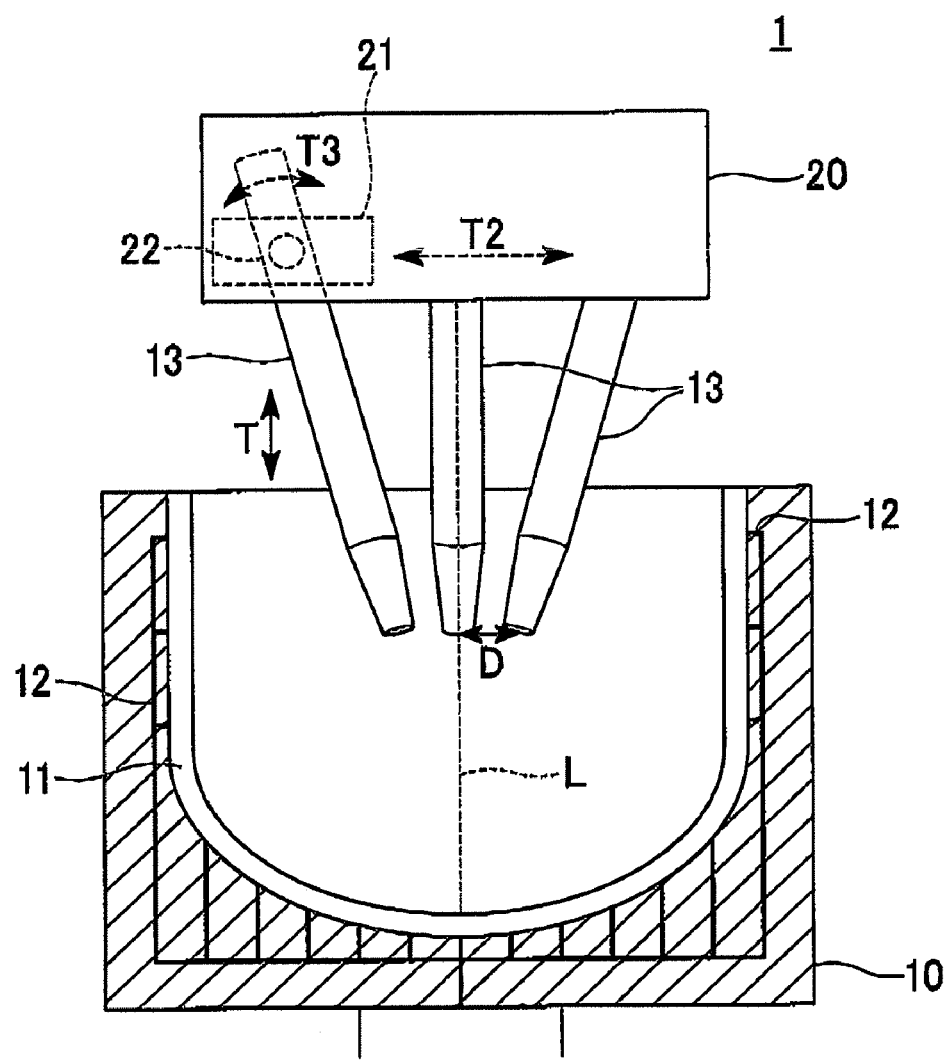
FIG. 1 is a front cross-sectional view schematically showing an apparatus for manufacturing a vitreous silica crucible according to the present invention.

FIG. 1 is a front cross-sectional view showing an apparatus for manufacturing a vitreous silica crucible according to the embodiment of the invention. In the drawing, a reference numeral 1 denotes the apparatus for manufacturing the vitreous silica crucible.

A method of manufacturing the vitreous silica crucible of the present invention is performed according to a rotary mold method using a vitreous silica crucible manufacturing apparatus 1. The vitreous silica crucible manufacturing apparatus 1 includes, as shown in FIG. 1, a mold 10 which rotates by a rotation unit (not shown) and defines the appearance of the vitreous silica crucible. Raw material powder (silica powder) is filled in the mold 10 by a predetermined thickness so as to form a quartz powder molding 11. In the mold 10, a plurality of ventilation ports 12 connected to a depressurization unit (not shown) and penetrating through the inner surface thereof is provided such that the inside of the quartz powder molding 11 is depressurized. Carbon electrodes 13, 13 and 13 for arc heating connected to a power supply unit (not shown) are provided above the mold so as to heat the quartz powder molding 11. The carbon electrodes 13, 13 and 13 can move vertically and set a distance D between the electrodes by an electrode position setting unit 20 as denoted by an arrow T and an arrow D of the drawing.

The vitreous silica crucible manufacturing apparatus 1 is a high-output apparatus for heating and melting a non-conductive object (quartz powder) by arc discharge by the plurality of carbon electrodes 13, 13 and 13 in an output range of 300 kVA to 12,000 kVA.

Figure 2:
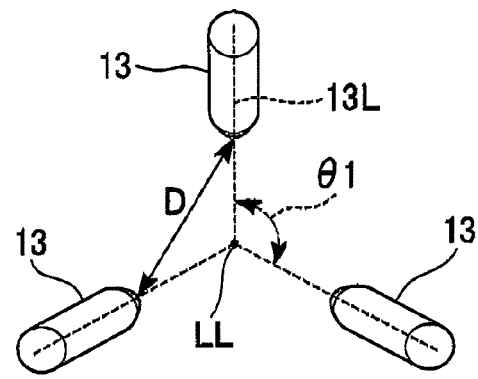
FIG. 2 is a plan view schematically showing an electrode arrangement state of the apparatus for manufacturing the vitreous silica crucible according to the present invention.
Figure 3:
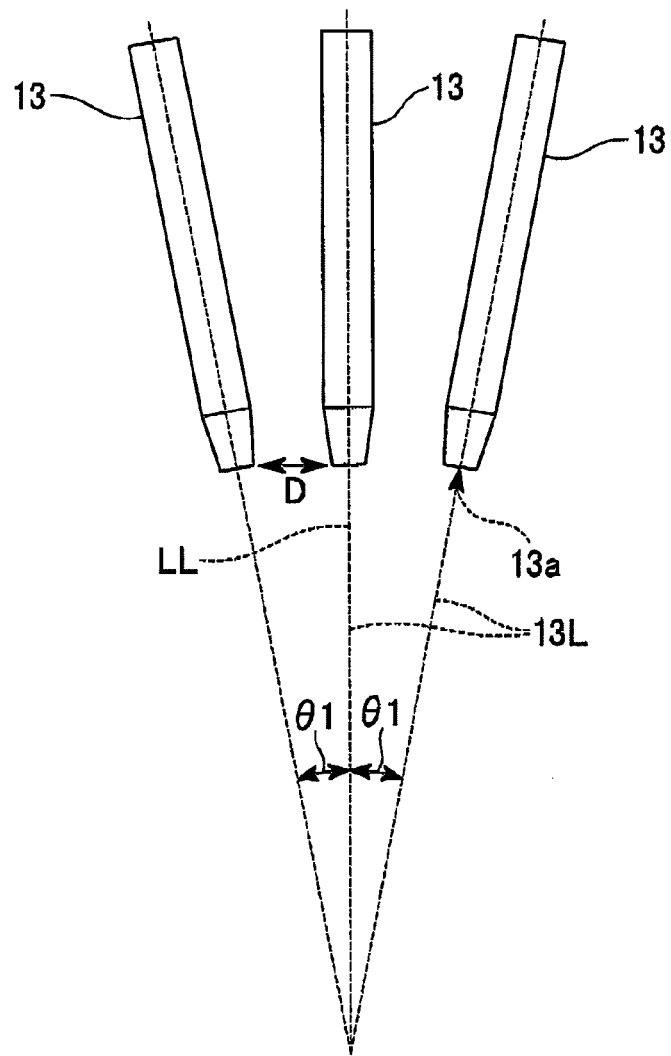
FIG. 3 is a front view schematically showing the electrode arrangement state of the apparatus for manufacturing the vitreous silica crucible according to the present invention.

FIGS. 2 and 3 are side views schematically showing the positions of the carbon electrodes of an arc discharge device according to the present embodiment.

The carbon electrodes 13, 13 and 13 are electrode rods which have the same shape and perform, for example, arc discharge of AC three phases (R-phase, S-phase and T-phase) and are arranged so as to form an inverted triangular pyramid having an apex at a lower side thereof such that axial lines 13L form an angle θ1, as shown in FIGS. 2 and 3. In addition, the conduction of the electrodes 13 can be controlled by a control unit (not shown). Shown in FIGS. 2 and 3, as the setup positions of the electrodes 13, a direction of arc blowoff is coincident with the central line of the electrode position LL.

The electrode position setting unit 20 includes, as shown in FIG. 1, supports 21 for supporting the carbon electrodes 13, 13 and 13 such that the distance D between the electrodes allows to be set, a horizontal movement unit for moving the supports 21 horizontally, a vertical movement unit for integrally moving the plurality of supports 21 and the horizontal movement unit vertically, and, for the support 21, a rotation unit for rotatably supporting the carbon electrodes 13 around an angle setting shaft 22 and controlling a rotation angle of the angle setting shaft 22.

Figure 9:
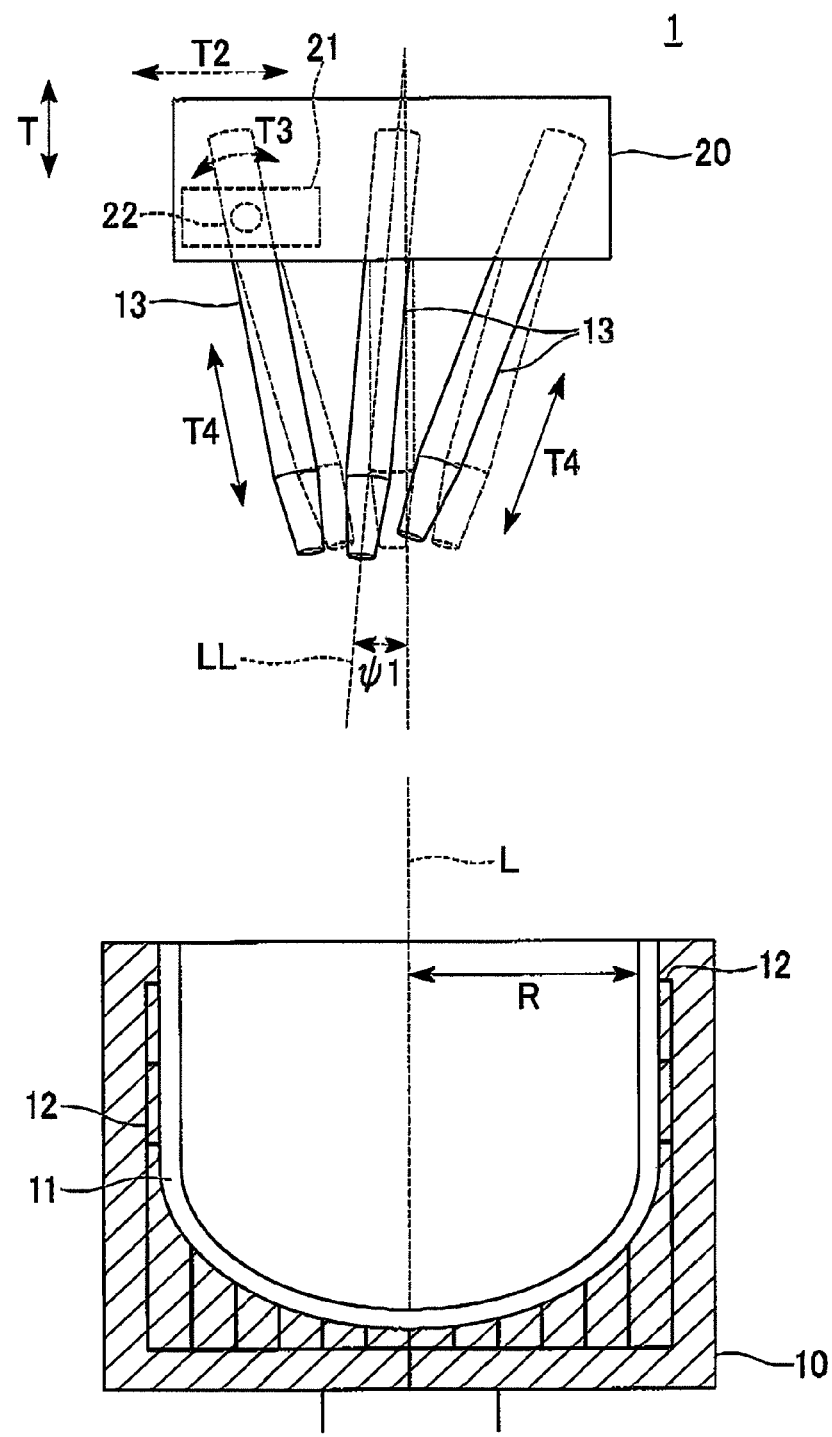
FIG. 9 is a front cross-sectional view schematically showing the arc state, in which the arc electrodes are displaced, of the apparatus for manufacturing the vitreous silica crucible according to the present invention.

In order to control the distance D between the carbon electrodes 13 and 13 and the state of the electrodes position, the angle of the carbon electrode 13 is controlled by the rotation angle setting unit as denoted by an arrow T3 of FIG. 1 and the horizontal position of the supports 21 is controlled by the horizontal movement unit as denoted by an arrow T2 of FIG. 1. In addition, the horizontal direction positions of the central line of the electrode position LL and the mold rotating center L are controlled by the horizontal movement unit. As denoted by an arrow T of FIG. 1, the height position of the supports 21 is controlled by the vertical movement unit such that the height position of electrode front ends 13a relative to the position of the bottom of the silica powder molding 11 is controlled. At the same time, by the rotation angle setting unit as denoted by FIG. 9, the angle of electrode 13 is individually set, the generated direction of arc flame (the central line of the electrode position) LL may be controlled so that the angle $\phi 1$ is displaced from vertical direction.

Although the support 21 of the carbon electrode 13 located at the left side is shown in the drawing, the other electrodes are supported by the same configuration and the height (an arrow T), the horizontal position (an arrow T2), the angle (an arrow T3) and the longitudinal dimension (an arrow T4) of the carbon electrodes 13 may be individually controlled by combination of these setting units.

Figure 11:
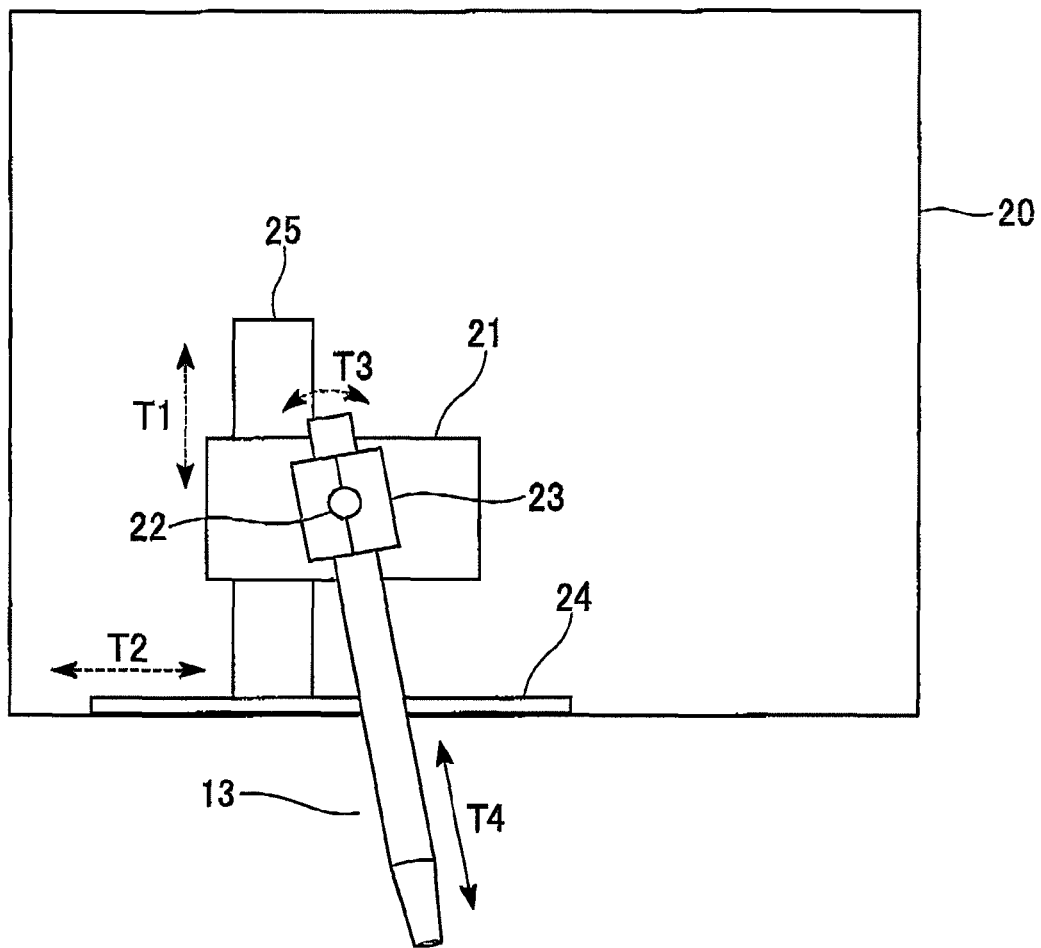
FIG. 11 is a front cross-sectional view schematically showing the electrode position setting unit of the apparatus for manufacturing the vitreous silica crucible according to the present invention.

The electrode position setting unit 20 includes, as shown in FIG. 11, the base 24 allows to be move horizontal direction (XY direction) on the ceiling portion which separate the vitreous silica crucible manufacturing apparatus into inner space and outer space on upper side of mold 10. The base 24 is provided the vertically position controlling unit 25 which is control vertical direction of the supports 21 by rack and pinion etc. and the supports 21 which may be moved to the vertical direction T1. The supports 21 is provided the supports of electrode 23 which may be rotated around the rotation axis line 22. The supports of electrode 23 supports the electrodes 13 as a chuck tool and may be set the longitudinal dimension T4 and to be removed. The rotation angle of the supports 21 and the supports of electrode 23, the horizontal direction of the base 24 and the vertical direction of the vertically position controlling unit 25 and the support 21 may be set by not shown position controlling unit and the driving unit which drive the position controlling unit.

Figure 10:
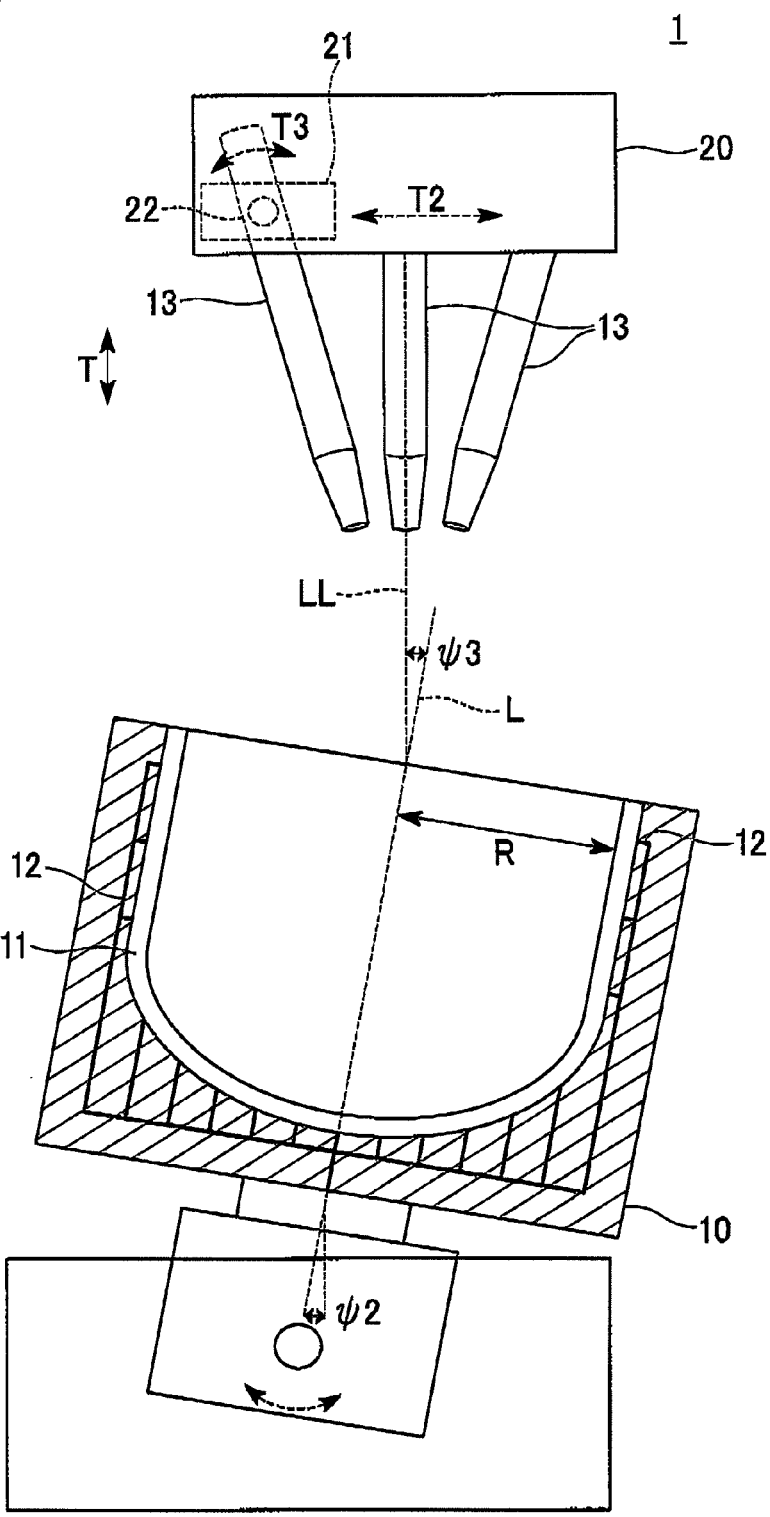
FIG. 10 is a front cross-sectional view schematically showing the arc state, in which the arc electrodes and the mold are displaced, of the apparatus for manufacturing the vitreous silica crucible according to the present invention.

In the present invention, other structures may be used if the positions of the electrodes 13 can be controlled. In particular, in part or in addition these structures, shown in FIG. 10, using the mold position setting unit which allow to displace the mold from vertical direction, the rotation axis line L of the mold 10 (the mold rotating central line) is set the position thereof that the mold rotating central line is vertically-shifted the angle $\phi 2$ around the horizontal rotation axis 31.

First, the electrode position state at the time of starting arc discharge will be described.

Before starting the arc discharge and at the time of starting the arc discharge, the carbon electrodes 13 are axially-symmetrically set with respect to an electrode position central line LL which is a vertical line equal to a central line L which is a mold rotation center L as center arc. In more detail, as shown in FIGS. 2 and 3, the carbon electrodes are set to form the inverted triangular pyramid having the apex at the lower side thereof such that the respective axial lines 13L thereof form the angle $\theta 1$.

Figure 4:
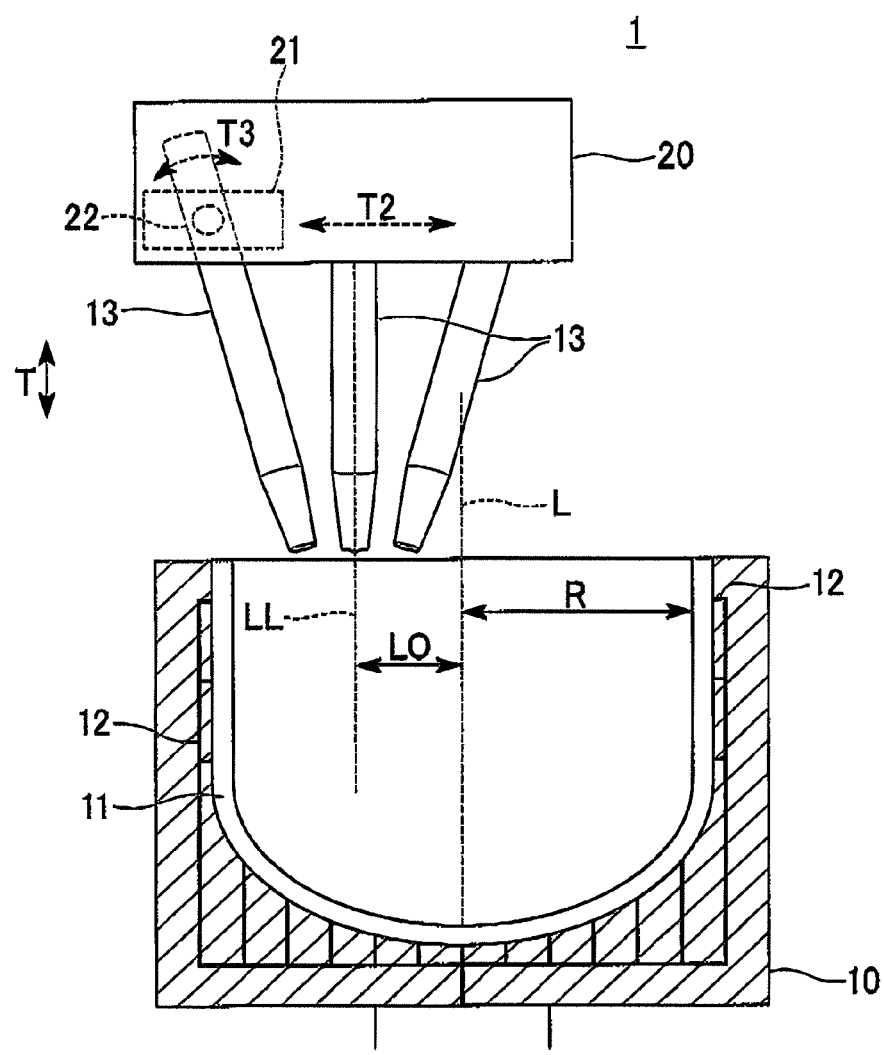
FIG. 4 is a front view schematically showing the eccentric arc electrode arrangement state of the apparatus for manufacturing the vitreous silica crucible according to the present invention.

Subsequently, the mold 10 in which the quartz powder molding 11 of the raw material is filled rotates, power supply is started, and a stable arc flame is generated after starting the arc discharge In this state, by the electrode position setting unit 20, as shown in FIG. 4, the electrodes 13 are set to be shifted from the mold central line. That is, the electrodes 13 are set such that the electrode position central line LL is parallel to and is separated from the mold rotation axis line L by a distance L0 at the inside of the quartz powder molding 11 of the mold 10 in plan view. In addition, at this time, the height positions of the electrodes 13 and the mold 10 may be changed or the height positions of the electrodes 13 and the mold 10 may not be changed.

The position setting using the electrode position setting unit 20 is performed such that the distance L0 becomes 0.03 to 0.9, preferably 0.05 to 0.4, more preferably 0.1 to 0.3, even more preferably 0.25 of the radius R of the mold 10. Accordingly, as schematically shown in FIG. 5, since arc melting is performed in a state in which the electrodes 13 are provided to be shifted from the mold central line L, the space in which the electrodes 13 are separated from the inner surface of the mold becomes wide and an air current tends to flow out via this space, thereby increasing outer circulating flow Gout.

To this end, since most of the high-temperature gas generated from the front ends of the electrodes 13 becomes one-direction air current which flows along the inner surface of the crucible (inner surface of the quartz powder molding) toward this space, the inner circulating flow Gin of the high-temperature gas is remarkably reduced and thus excessive heating due to the inner circulating flow hardly occurs. In addition, in the state shown in FIG. 9 and FIG. 10, the position setting of the angle $\phi 1$, the angle $\phi 2$, and the electrodes level of the mold allows to perform the same state which is the setting of the distance L0.

Figure 5:
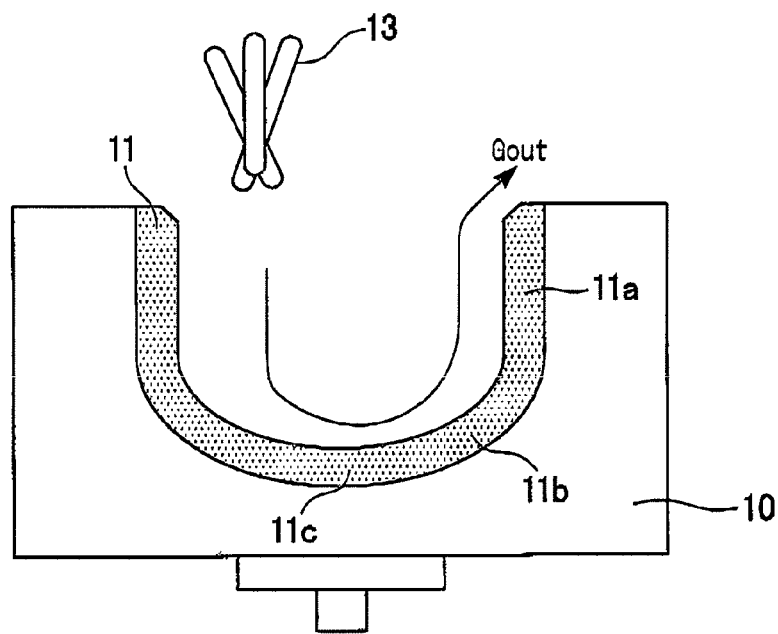
FIG. 5 is a cross-sectional view schematically showing high-temperature gas flow of eccentric arc according to the present invention.

In the manufacturing method of the present invention, since the excessive heating due to the inner circulating flow hardly occurs, as shown in FIG. 5, the glass temperature difference during melting can be controlled to 300° C. or less at the positions of the straight body portion 11a, the curved portion 11b and the bottom 11c of the quartz powder molding 11 respectively corresponding to the straight body portion, the curved portion and the bottom of the vitreous silica crucible. By the uniform heating, as shown in FIG. 6, the thickness of the transparent layer C0 of the straight body portion C1 and the bottom C3 of the crucible C can be controlled to 70 to 120% of the thickness of the transparent C0 of the curved portion 2.

Figure 6:
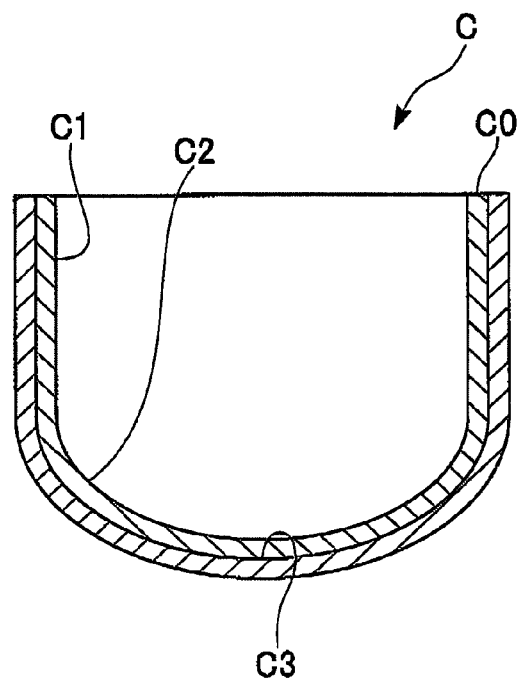
FIG. 6 is a front cross-sectional view showing the vitreous silica crucible according to the present invention.

The vitreous silica crucible C manufactured by the method of the present invention includes, as shown in FIG. 6, the transparent layer having the thickness of the transparent layer C0 of the straight body portion C1, the curved portion C2 and the bottom C3 of the crucible within a fixed range and having uniform characteristics.

To this end, in pulling of single-crystal silicon, since heat radiation due to external heating is uniform and the temperature of the surface of the crucible becomes uniform, when the single-crystal silicon is pulled using this vitreous silica crucible, it is possible to improve the yield of the single-crystal crystal. By controlling the glass temperature during melting to the above range, the erosion speed of the transparent layer C0 in the inner surface of the crucible at the time of pulling becomes uniform and a deviation in oxygen concentration in the vertical direction (pulling axis direction) of the pulled single-crystal silicon is reduced, thereby pulling single-crystal silicon with high quality.

In the present invention, for the method of arc melting in a state in which the electrodes are provided so as to be shifted from the mold central line, instead of the method of changing the arrangement of the electrodes during arc melting, a method of positioning the rotary mold such that the rotation central line of the mold becomes the lateral side of the electrodes and providing the electrodes at the lateral side of the mold central line when the rotary mold is fed to the lower of the electrodes may also be employed.

As the method of providing the electrodes at the lateral side of the mold central line, instead of the method of providing the electrodes at the lateral side of the mold central line, a method of changing the number of electrodes conducted during arc melting as the arrangement of the electrodes of the center arc state may be employed. In this case, the number of electrodes is in a range of 3 to 20, and any one of electrode structures such as four 2-phase AC electrodes, six 2-phase AC electrodes, eight 2-phase AC electrodes, ten 2-phase AC electrodes, three 3-phase AC electrodes, six 3-phase AC electrodes, nine 3-phase AC electrodes, twelve 3-phase AC electrodes, fifteen 3-phase AC electrodes, four 4-phase AC electrodes, eight 4-phase AC electrodes, twelve 4-phase AC electrodes or sixteen 4-phase AC electrodes may be used. If the number of electrodes is 4 or more, a plurality of lines of electrodes may be set so as not to be simultaneously conducted.

In the method of changing the number of electrodes conducted during arc melting, the conducted electrodes may be alternately switched with respect to the plurality of electrodes. Accordingly, it is possible to reduce the consumption amount of the electrodes due to the are discharge. Specifically, with regard to the switching of the conducted electrodes, since it is changed according to the specifications of the actual machine or the like, it is preferable that the switching of the conducted electrodes be set such that excessive heating due to the inner circulating flow equivalent to the eccentric arc is prevented.

Figure 7:
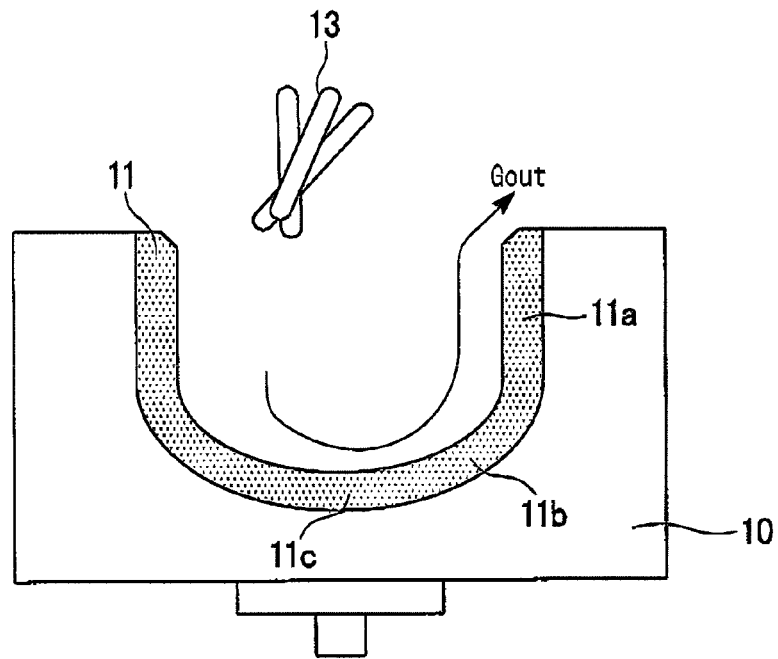
FIG. 7 is a front view schematically showing the eccentric arc electrode arrangement state, in which the electrodes are inclined, of the apparatus for manufacturing the vitreous silica crucible according to the present invention.
Figure 8:
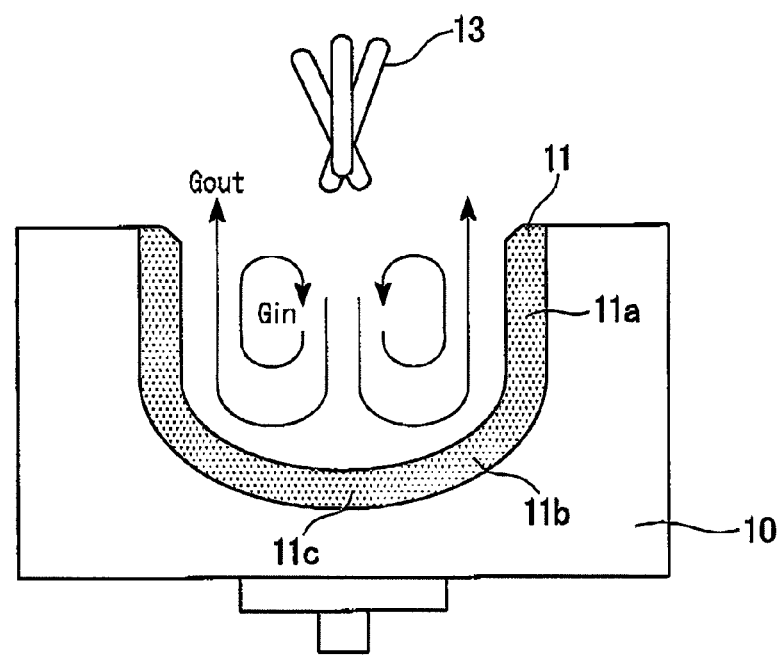
FIG. 8 is a front cross-sectional view schematically showing conventional center arc.

In addition, as the method of changing the arrangement of the electrodes during arc melting, as described above, instead of the unit for moving the electrodes to the later side, as shown in FIG. 7, the electrodes may be provided so as to be inclined to one side of the inner surface of the crucible, that is, the electrode position central line LL of the electrodes 13 is inclined by the electrode position setting unit 20 such that the distance from the inner surface of the crucible is changed. At this time, the electrode position setting unit 20 becomes a unit for inclining the electrodes. Specifically, with regard to the angle setting, since it is changed according to the specifications of the actual machine or the like, it is preferable that the angle be set such that excessive heating due to the inner circulating flow equivalent to the eccentric arc is prevented.

In addition, as the method of changing the arrangement of the electrodes during arc, the gap between the electrodes 13 may be changed by the electrode position setting unit 20 such that the distance from the inner surface of the crucible is changed. At this time, the position of the electrode position central line LL which is the gravity center of the electrodes is moved. Since the detailed setting is changed according to the specifications of the actual machine, it is preferable that the position be set such that excessive heating due to the inner circulating flow equivalent to the eccentric arc is prevented.

EXAMPLES

Hereinafter, Examples of the present invention will be described together with Comparative Examples.

In the Examples and the Comparative Examples, a vitreous silica crucible was manufactured on the basis of a rotary mold method. The bore of the mold was 28 inches and the average thickness of the quartz powder layer deposited on the inner surface of the mold was 28 mm. A conduction time was 60 mins and evacuation of the quartz powder deposition layer (quartz powder molding) was performed for 120 mins from the start of the conduction.

Examples 1 to 6

The electrodes of the number shown in Table 1 were used and were non-symmetrically arranged with respect to the mold rotation central line and quartz powder deposited on the inner surface of the mold was arc-melted and vitrified. The melting temperature and the temperature difference of the straight body portion, the curved portion and the bottom of the crucible during arc melting are shown in Table 1. In the manufactured vitreous silica crucible, the thickness ratios of the transparent layer of the straight body portion and the bottom to the transparent layer of the curved portion (the thickness ratio when the thickness of the transparent layer of the curved portion is 100) are shown in Table 1.

Comparative Examples 1 to 6

Except that the electrodes of the number shown in Table 1 were used and were point-symmetrically (Comparative Examples 1 to 3) linear-symmetrically (Comparative Examples 4 and 5) arranged with respect to the mold rotation central line, similar to the Examples, quartz powder deposited on the inner surface of the mold was arc-melted and vitrified. This result is shown in Table 1.

As shown in Table 1, in Examples, the melting temperature difference of the straight body portion, the curved portion and the bottom of the crucible is 50° C. to 200° C. and the temperature difference is small. Thus, the thickness of the transparent layer in the entire crucible is within a fixed range. More specifically, the thickness ratio of the transparent layer of the straight body portion and the bottom to the transparent layer of the curved portion is 90 to 110 and the uniformity of the thickness of the transparent layer of the entire crucible is high.

In contrast, in the Comparative Examples 1 to 6, the melting temperature difference of the straight body portion, the curved portion and the bottom of the crucible is 350° C. to 500° C. and the temperature difference is very large. Accordingly, the thickness ratio of the transparent layer of the straight body portion and the bottom to the transparent layer of the curved portion is 31 to 57, the transparent layer of the straight body portion and the bottom is significantly thinner than the curved portion, and the uniformity of the thickness of the transparent layer of the entire crucible is low.

TABLE 1

| | Electrodes | | Temperature (°C.) | | | | Thickness ratio of transparent layer (with respect to R portion) | | Yield of single crystal (%) |
|---|---|---|---|---|---|---|---|---|---|
| | Number | Arrangement | Straight body portion | Curved portion | bottom | Temperature difference | Straight body portion | bottom | |
| Example 1 | 3 | Non-symmetry | 2000 | 2100 | 1900 | 200 | 95 | 90 | 91 |
| Example 2 | 5 | Non-symmetry | 1800 | 1800 | 2000 | 100 | 90 | 110 | 88 |
| Example 3 | 7 | Non-symmetry | 1800 | 1850 | 1800 | 50 | 97 | 98 | 90 |
| Comparative Example 1 | 3 | Point-symmetry | 1700 | 1800 | 2150 | 450 | 49 | 43 | 54 |
| Comparative Example 2 | 5 | Point-symmetry | 1700 | 1900 | 2150 | 450 | 50 | 39 | 40 |
| Comparative Example 3 | 7 | Point-symmetry | 1700 | 1950 | 2200 | 500 | 49 | 31 | 39 |
| Comparative Example 4 | 3 | Linear-symmetry | 1750 | 1900 | 2100 | 350 | 44 | 57 | 55 |
| Comparative Example 5 | 5 | Linear-symmetry | 1750 | 1950 | 2150 | 400 | 46 | 41 | 31 |
| Comparative Example 6 | 7 | Linear-symmetry | 1800 | 2000 | 2150 | 350 | 31 | 54 | 38 |

In Table 1, the "non-symmetry" of the electrode arrangement indicates that the electrode arrangement is a non-equilateral triangle.

The "eccentricity" of the electrode arrangement indicates that the center LL of the equilateral triangle (triangle, pentagon or heptagon) formed by the apexes of the front ends of the electrodes is not consistent with the mold central line L. At this time, the distance between the electrodes is set to 100 mm.

In this case, the gravity point which is the planer electrode center LL and the mold central line L are separated from by the distance L0 which is 50% of the bore diameter of the vitreous silica crucible.

The "point-symmetry" of the electrode arrangement indicates that the electrodes are disposed at the apexes of a regular polygon of which the central position is consistent with the mold central line (the distance between the electrodes is 100 mm).

The "linear-symmetry" of the electrode arrangement indicates that the electrodes are disposed on a horizontal line (the distance between the electrodes is 100 mm), or at least one electrode is disposed on a horizontal line (the distance between the electrodes is 100 mm) through the mold central line and the position of other electrodes are set against this line.

Here, the yield of the single crystal (single crystallization degree) is the yield of the single crystal of the pulling of the single-crystal silicon and is the weight of the straight body portion which can obtain a wafer of single-crystal silicon without crystal dislocation/the total weight of polysilicon which is the raw material inserted into the crucible. When the single crystallization degree is changed by 1%, the number of wafers which can be obtained is changed by 20.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of manufacturing a vitreous silica crucible by arc melting silica powder deposited on an inner surface of a rotary mold, wherein a plurality of electrodes are axially-symmetrically set with respect to an electrode position central line which is a vertical line equal to a central line which is a mold rotation center, wherein the arc melting is performed so as to switch electrodes powered during the arc melting with respect to the plurality of electrodes so that the direction of the arc flame generated during the arc melting is displaced from a mold rotating central line.

2. The method according to claim 1, wherein the glass temperature difference during melting of a straight body portion, a curved portion and a bottom of the vitreous silica crucible is controlled to 300° C. or less by performing the arc melting in a state in which the electrodes are provided so as to be displaced from the mold central line.

3. The method according to claim 1, wherein the thickness of a transparent layer of a straight body portion and a bottom of the vitreous silica crucible is controlled to 70 to 120% of the thickness of a transparent layer of a curved portion by performing the arc melting in a state in which the electrodes are provided so as to be displaced from the mold central line.

* * * * *